United States Patent [19]

De Jonge et al.

[11] 4,004,287
[45] Jan. 18, 1977

[54] HOLLOW MAGNETIC DOMAIN RECORDING DEVICE

[75] Inventors: Frederik Ate De Jonge; Willem Frederik Druijvesteijn; Antonius Gerardus Hendrikus Verhulst, all of Eindhoven, Netherlands

[73] Assignee: U.S. Philips Corporation, New York, N.Y.

[22] Filed: June 30, 1975

[21] Appl. No.: 591,705

Related U.S. Application Data

[63] Continuation of Ser. No. 345,663, March 28, 1973, abandoned, which is a continuation of Ser. No. 165,025, July 22, 1971, abandoned.

[52] U.S. Cl. .......................................... 340/174 TF
[51] Int. Cl.² ........................................ G11C 11/14
[58] Field of Search ............................. 340/174 TF

[56] References Cited

UNITED STATES PATENTS 3,140,471   7/1964   Fuller ......................... 340/174 TF
3,811,119   5/1974   Almasi et al. ................ 340/174 TF

OTHER PUBLICATIONS

Journal of Applied Physics – vol. 42, No. 4; Mar. 15, 1971, pp. 1270–1272.
IBM Technical Disclosure – vol. 13, No. 10, Mar. 1971, p. 3021.
IBM Technical Disclosure Bulletin – vol. 17, No. 11, Apr. 1975, pp. 3459–3460.

*Primary Examiner*—James W. Moffitt
*Attorney, Agent, or Firm*—Frank R. Trifari; Daniel R. McGlynn

[57] ABSTRACT

A recording device in which hollow magnetic domains are produced in plates of, for example, orthoferrite by means of a magnetic field. The region within which the field can vary without said domains disappearing depends upon the coercive force of the material. Field variations cause a particular irreversible variation in the domain dimensions, provided a certain minimum coercive force is present. In particular, in order to increase the stability of a hollow domain, a single-walled domain is present within it.

8 Claims, 12 Drawing Figures

HOLLOW MAGNETIC DOMAIN RECORDING DEVICE

This is a continuation of application Ser. No. 345,663, filed Mar. 28, 1973, now abandoned, which is a continuation of application Ser. No. 165,025, filed July 22, 1971, now abandoned.

The invention relates to a recording device comprising as a recording medium a thin layer of a magnetizable material which has an easy direction of magnetization which is approximately at right angles to the surface of the layer, and further comprising means for producing, maintaining and possibly destroying magnetic domains in said medium.

Such a device is mentioned in "Electronics" September, 1969, p. 83 et seq. As a recording medium serve thin plates of, for example, rare earth ortho-ferrites. These plates show an easy direction of magnetization which is at right angles to the plates. As a means for producing, maintaining and possibly destroying again the magnetic domains in the plates serves an external magnetic field $H_o$, the direction of which coincides, at least mainly, with the said easy direction of magnetization of the recording medium. The magnetic domains are circular cylindrical and these can exist in a stable form only with magnetic fields $H_o$, the strength of which lies between certain limits. These limit values for the field depend inter alia upon the thickness of the plate in which the domains occur, and upon the chemical composition thereof.

If the direction of magnetization within the domains is directed opposite to the direction of $H_o$ and $H_o$ is varied within the said limits, the domains with increasing $H_o$ become smaller and with decreasing $H_o$ become larger.

The domains can be observed optically: the dimensions can be accurately determined by means of polarized light and an analyser.

It is possible in two manners to cause a memory to function by means of the said domains.

Firstly, a variation in the strength of $H_o$ — provided said variation is within the limits imposed thereon by the requirement that a stable domain must be capable of existing — can be refound in a variation in the dimensions of the domain. This can be determined, for example, optically.

Secondly, it is possible to move the domains; a kind of shift register can be realized by means of this property.

Figure 1:
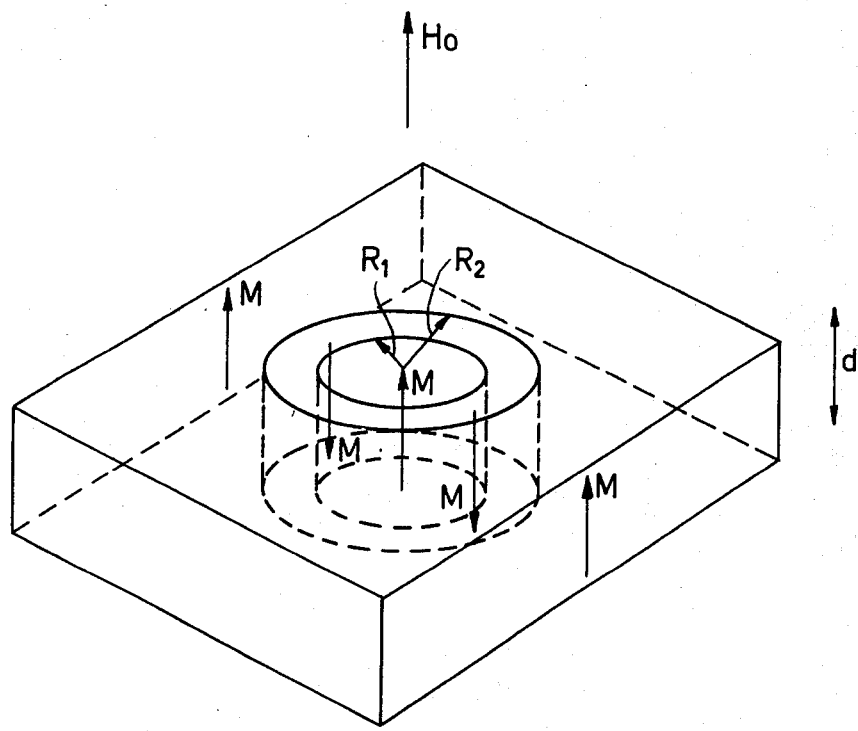
FIG. 1 is a diagrammatic perspective view of a hollow magnetic domain according to the present invention.

The invention relates to a device of the above-described type, which is characterized in that the means are of such a nature that at least a part of the domains is hollow. Domains are to be understood to mean those regions in which the direction of the magnetization is directed opposite to the external magnetic field. If $R_1$ and $R_2$ are the inner and outer radius, respectively, of a hollow cylindrical domain (see FIG. 1) the magnetization for radii $r$ with $R_1 < r < R_2$ is directed opposite to the external field $H_o$, while in the innermost $(r < R_1)$ the magnetization, as is the case outside the domain $(r < R_2)$ is parallel thereto. The thickness of the plate of orthoferrite is denoted by $d$ in FIG. 1.

It has been found that, compared with the circular cylindrical and hence single-walled domains known hitherto, hollow domains present many advantages.

A significant advantage is that, in order to obtain the same variation (for example 25%) in the radius of a cylinder in a hollow domain as in a single-walled domain, a variation in the strength of the external magnetic field $H_o$ — the signal — for the hollow domain is required of, for example, only 1/100 times that which is required with a single-walled domain. So a hollow domain has a much larger signal sensitivity.

A further advantage is that the diameter of a hollow domain can vary much more strongly than that of a single-walled domain. It has been found that in a single-walled domain in a plate of lutecium orthoferrite, which has a saturation magnetization $M_s$ determined by $4\pi M_s = 95$ gauss and a wall energy of 1.6 erg/cm$^2$, with a thickness of 47 $\mu$, this variation possibility is a factor 3, while in a hollow domain in a plate of the same dimensions and composition this turned out to be a factor > 100.

Both above-mentioned advantages of hollow domains also become significant when a shift register memory is realized by means of these domains. A known method of causing domains to move is based on the presence of conductive tracks suitable for that purpose along which the domain moves in a desirable direction on the basis of periodic changes in the size of the domain (caused by a periodically varying magnetic field). For the variations in size of a domain, required for this purpose, the greater sensitivity to variations in the external magnetic field and the greater possible variations in dimensions of the domain are essential advantages.

For the said purpose, a recording device according to the invention is particularly characterized in that known means are present to move the domains. Such means are indicated, for example, in the already mentioned publicaton in "Electronics".

It has been found that in a plate of lutecium orthoferrite, thickness 47 $\mu$, stable hollow substantially circular-cylindrical domains can exist only with external fields between 11.8 and 11.9 Oe. A variation in the external field of 0.1 Oe thus is maximally permitted. For stable single-walled, substantially circular cylindrical domains this variation possibility in $H_o$ in the same plate was found to be 5.2 Oe — from 10.3 to 15.5 Oe. The comparatively small variation possibility for the hollow domains is felt as a drawback in certain circumstances.

Experiments have demonstrated, however, that the region within which the external magnetic field can be varied, can be considerably increased by ensuring that so-called pinning places for the walls are present in the recording medium. For that purpose, lattice defects have to be introduced into the material of which the recording medium consists, for example, by means of impurities, as a result of which the medium above a certain coercive force. For example, in a medium consisting of lutecium orthoferrite having a coercive force of 5 Oe and a thickness of 75 $\mu$, the variation possibility for the external field in a given case was found to be increasable from 0.1 Oe to approximately 30 Oe. It was also found that both the upper limit and the lower limit for the permitted magnetic field was higher and lower, respectively, than that for single-walled domains in the same material. It is to be noted that also in the case of single-walled domains with a higher coercive force, the region within which $H_o$ can vary is larger. This extension, however, is both absolutely and relatively considerably smaller than in the case of hollow domains.

Figure 2:
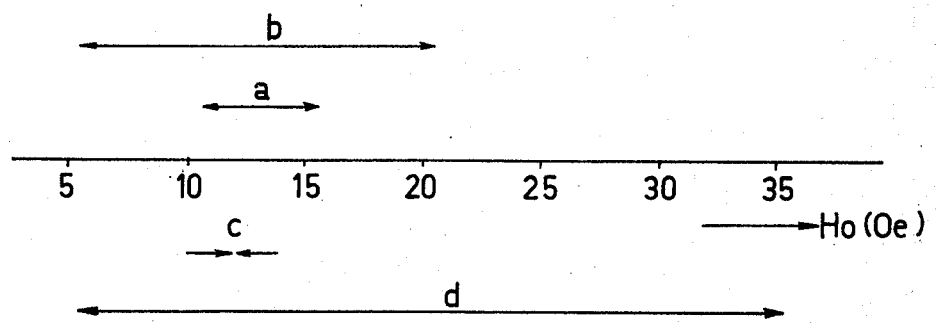
FIG. 2 indicates the range of variations of magnetic fields referred to in the invention.

The above will be explained with reference to FIG. 2, in which $a$ and $b$ denote the variation possibilities for $H_o$ for stable single-walled domains with a coercive force equal to 0 and 5 Oe, respectively, while $c$ and $d$ denote said possibilities for the stable hollow domain.

It has been found that small coercive forces, for example 0.1 Oe, already result in a considerable extension of the region permitted for $H_o$ and an embodiment of a device according to the invention is therefore characterized in that the recording medium shows a coercive force.

It has furthermore been found that with a hollow domain the region within which the external magnetic field can be varied can be considerably increased in another manner than by the intentional provision of extra pinning places for the walls by ensuring that a single-walled domain is present within a hollow domain. The field region within which such a structure is stable is four to five times larger than the field region of a structure in the absence of a single-walled domain. Compared with a single-walled domain, a structure of a hollow domain with a single-walled domain situated within it has the advantage that the variation of the dimensions of the domains as a function of the field is much larger. In order to obtain the same variation (for example 25%) in the radius of a cylinder in a hollow domain, which forms part of a structure of a hollow domain with a single-walled domain present within it, as in a single-walled domain, a variation in the strength of the external magnetic field $H_o$ — the signal — for the said hollow domain of, for example, only 1/15 times that which is required with a single-walled domain is required. Therefore, the means are in particular of such a nature that, at least within a part of the hollow domains, a single-walled domain is present.

Figure 10:
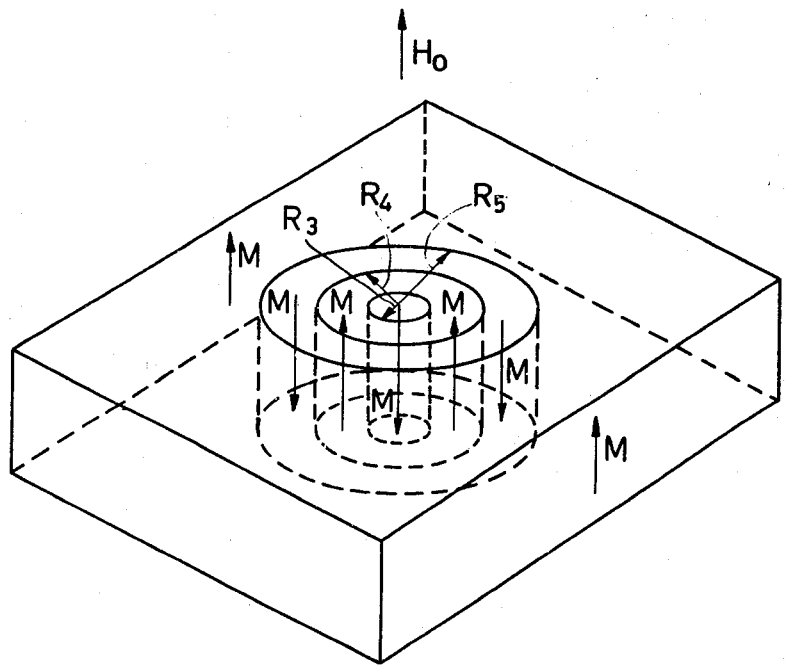
FIG. 10 shows another structure of a hollow domain.

FIG. 10 shows a plate of orthoferrite of thickness d. $R_4$ and $R_5$ are the inner and outer radius, respectively, of a hollow cylindrical domain within which a cylindrical domain of radius $R_3$ is present. For radii $r$ with $r < R_3$ and $R_4 < r < R_5$ the magnetization is opposite to the external field $H_o$ while between the two domains (that is to say for $R_3 < r < R_4$) and outside the hollow cylinder (that is to say for $r < R_5$) the magnetization is parallel to the external field.

It has been found that in a plate of lutecium orthoferrite, thickness 47 $\mu$, stable structures of a hollow domain with a single-walled domain present within it can exist with external fields between 11.8 and 12.2 Oe. A variation in the external field of 0.4 Oe thus is maximally permitted.

The region within which the external magnetic field can be varied — which region in itself is already larger — can be increased in this case also by ensuring that so-called pinning places for the walls are present in the recording medium, as has been described above.

It has been found that in a plate of yterbium orthoferrite having a thickness of 100 $\mu$, stable structures of a hollow domain with a single-walled domain present within it can exist without the intentional provision of extra pinning places for the walls, with external fields between 42.4 and 43.4 Oe, so that a variation in the external field of 1 Oe is maximally permitted. With a coercive force of approximately 0.5 Oe, a variation in the external field of 2 Oe is maximally permitted.

In performing experiments on plates having different coercive forces, another property of hollow domains become significant which may be of great use for recording purposes: it has been found that when the coercive force of a plate of, for example, lutecium orthoferrite was increased to above 0.1 Oe, the variation which occurs in the domain size of a hollow domain as a function of the external field $H_o$, is not reversible and quite different from that of a single-walled domain.

An embodiment of the device according to the invention therefore comprises a recording medium having a coercive force of such a value that variations of the domain size as a function of the external magnetic field are irreversible.

Figure 3A:
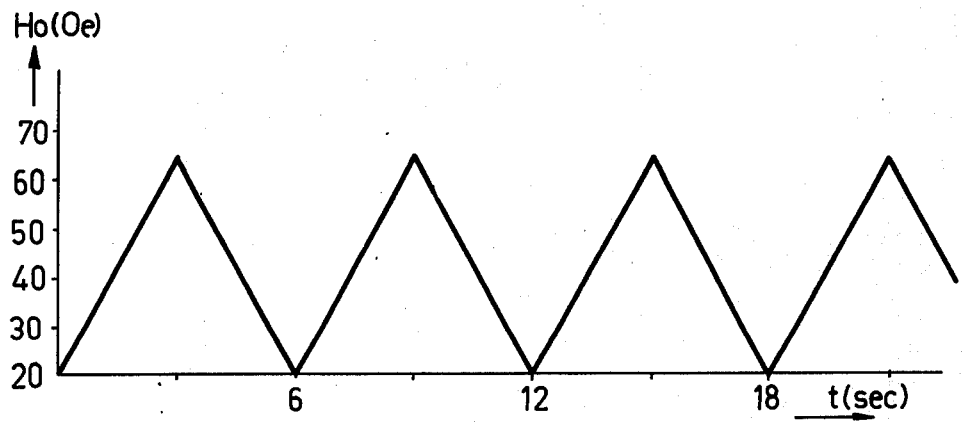
FIG. 3a represents a periodically varying magnetic field.
Figure 3B:
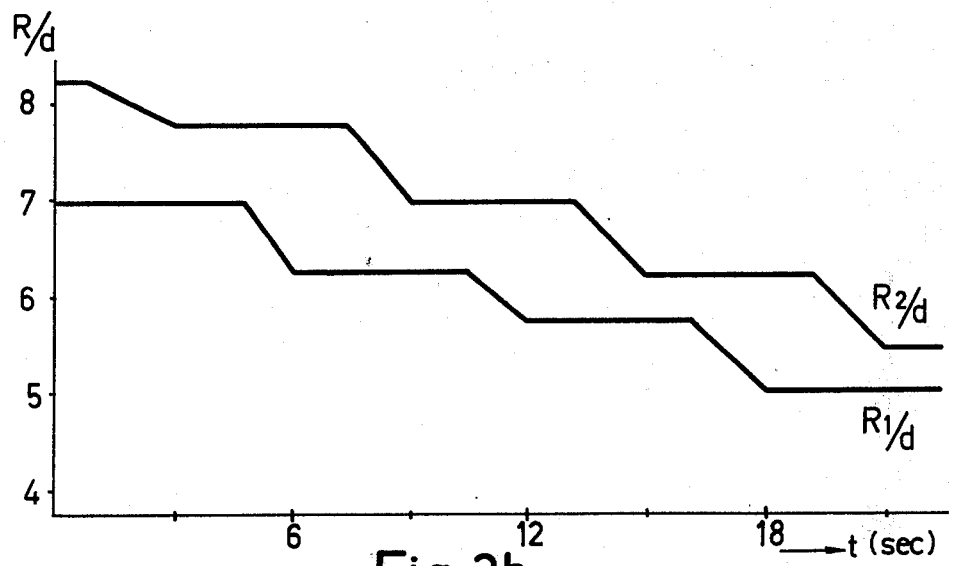
FIG. 3b represents a radii of the domain as a function of time.

The above will be explained with reference to FIG. 3. In a plate of lutecium orthoferrite having a coercive force of 11.5 Oe and a thickness of 47 $\mu$ the variation of $R_1$ and $R_2$ as a function of a field which periodically — for example, having a cycle of 6 sec. — increases (to 65 Oe) and again decreases (to 20 Oerstedt) (see graph 3a) was measured in hollow cylindrical domains.

The $R_1/d$ and $R_2/d$ ($d$ is the thickness of the plate) are plotted in graph 3b as a function of time — and hence of the field $H_o$.

In addition to the irreversibility of the variation in the domain dimensions which can be read from this graph, it may also be apparent from said graph that $R_1$ and $R_2$ during one $H_o$ cycle, do not vary simultaneously: whereas with a varying field $H_o$ the radii of the cylinders in total decrease with each cycle, $R_2 - R_1$ during one cycle appears to vary with the same frequency as that of the field, since $R_2$ and $R_1$ begin to decrease at different instants within said cycle; with increasing field, first $R_2$ decreases, then with a decreasing field, $R_1$ decreases. This may be used, for example, for storing extra recordings. With single-walled domains the radius of the cylinder is unchanged after each cycle.

Also with a structure of a hollow domain with a single-walled domain present within it, a variation in the domain sizes which is non-reversible and quite different from that of a single-walled domain occurs as a function of the external field $H_o$ in the presence of a given coercive force. The radii of the hollow domain and the radius of the single-walled domain present within it do not vary simultaneously during one $H_o$ cycle, while with a varying field $H_o$ the three said radii increase in total with each cycle.

Hollow domains can be produced in the recording medium in various manners.

According to an embodiment of a device according to the invention, said means for producing hollow domains is a pair of magnetic tweezers.

The operation hereof will be explained with reference to FIGS. 4, 5, 6 and 7 of the accompanying drawings.

Figure 4:
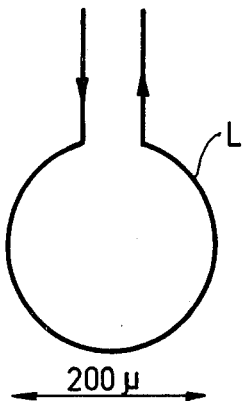
FIG. 4 represents a wire loop.

FIG. 4 shows a wire loop L — the tweezers — through which a current flows in the direction shown. The diameter of the loop L is, for example, 200 $\mu$ and the wire thickness 50 $\mu$. In order to prevent too much energy from being dissipated in the wire loop L, a pulsatory current is conveyed through the wire.

Figure 5:
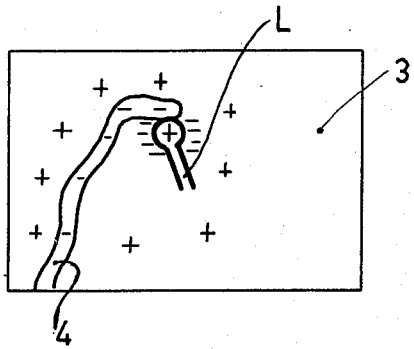
FIG. 5 shows the wire loop in contact with a domain.
Figure 6:
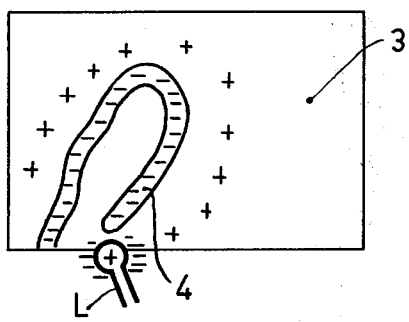
FIG. 6 shows a manipulation of the shape of the domain by the wire loop.
Figure 7:
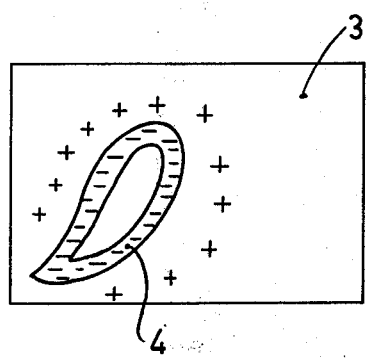
FIG. 7 shows a creation of a hollow domain.

As shown in FIG. 5, the wire loop L is contacted with a magnetic domain 4 present in the plate 3. It is ensured that the field on the outside of the wire loop L, as regards direction fits in with the direction of the saturation magnetization of the domain 4, and that the strength of said field is of the same order of magnitude as said saturation magnetization (for example 100 Oe by means of a current of 6 amperes and a pulse duration of 3 $\mu$sec.). By means of the tweezers L, on end of the domain 4 can be moved in the direction of the other end of the domain 4, for example, attached to the edge of the plate (see FIG. 6). By reversing finally the polarity of the tweezers L and "cutting loose" the domain 4 from the pinning place, in this case the edge of the plate, the hollow domain can be obtained by closing the domain, see FIG. 7. Essential in this case is that domains 4 are used which are pinned at least at one end, for example are "hooked" to the edge of the plate 3, since otherwise no closed domains can be realized owing to the repellent forces.

Figure 8:
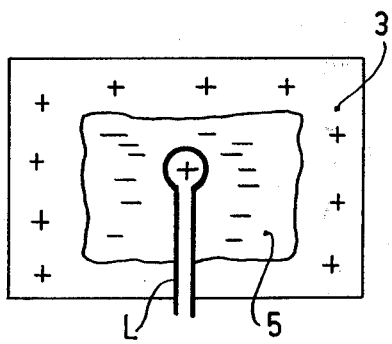
FIG. 8 shows another manner of creating a hollow domain.

Another manner of producing hollow magnetic domains is that in which "a hole is burnt" as it were in a magnetic domain 5 by means of magnetic tweezers L (see FIG. 8). "A hole" is to be understood to mean a region in which the magnetization direction is opposite to that prevailing around it. This is possible when the field produced by means of the tweezers L is directed opposite to the direction of magnetization of the domain 5, and when the strength of said field is such that the direction of magnetization of a part of the domain can be reversed.

FIG. 8 diagrammatically shows the above method. Starting material was, for example, a domain 5 having a largest linear dimension of 400 $\mu$ in which a hollow magnetic domain was realized by means of tweezers L with which a field of approximately 3000 Oe was produced by means of a pulsatory current of 80 amperes.

Figure 9:
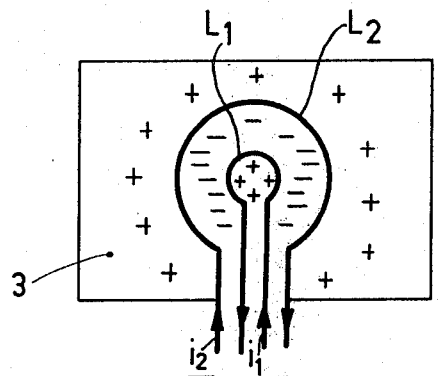
FIG. 9 shows the use of concentric wire loop to create a hollow domain.

It is also possible to produce hollow magnetic domains by using concentric wire loops $L_1$ and $L_2$ as shown in FIG. 9. By correctly choosing the ratio of the current strengths $i_1$ and $i_2$, it is possible to achieve that the magnetic field between the wire loops $L_1$ and $L_2$ has a direction opposite to the direction of the magnetization of the homogeneously magnetized plate 3. A hollow domain was realized, for example, with $i_1 = 300$ amp; $i_2 = 100$ amp. The field between the loops $L_1$ and $L_2$ was approximately 5000 Oe, while that within the inner loop $L_2$ was approximately 8500 Oe.

In general it may be said that an embodiment of the recording device according to the invention is characterized in that the means for producing the hollow magnetic domains consists of two wire loops in which during use the projection of one on the recording medium falls entirely within that of the other thereon, the current directions being such that the resulting has a direction opposite to that of the magnetization of the medium at that area. If the wire loops are present on the same side of the medium this means that the directions of current are opposite; if the wire loops are present on different sides of the plate, the current directions will be the same.

A variation of this method is that in which first a current $i_2$ is conveyed through the outer loop $L_2$, after which a hole is burnt in the inner region of loop $L_2$ by means of a current of $i_1$ through wire loop $L_1$.

Figure 11:
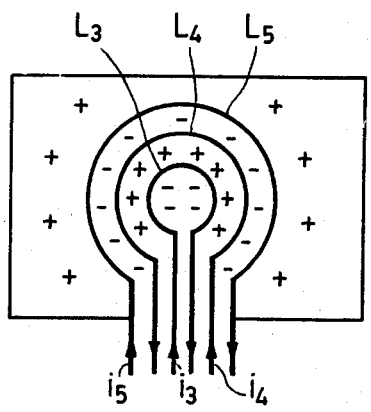
FIG. 11 shows a method of providing the domain of FIG. 10.

A structure of a hollow magnetic domain with a single-walled magnetic domain present within it can be produced by using concentric wire loops $L_3$, $L_4$ and $L_5$ as shown in FIG. 11. By correctly choosing the ratio of the current strengths $i_3$, $i_4$ and $i_5$, it is possible to achieve that the magnetic fields within the wire loop $L_3$ and between the wires loops $L_4$ and $L_5$ have a direction which is opposite to the direction of magnetization in the remaining parts of the plate. The means for producing the structure of a hollow magnetic domain with a single-walled magnetic domain present within it, consists in particular of three wire loops in which during use the projections of the second and the third on the recording medium fall entirely within that of the first thereon and the projection of the third on the recording medium falls entirely within that of the second thereon, the current directions being such that the resulting magnetic fields in the regions between the projections have directions which are alternately opposite and in the same direction to that of the magnetization of the medium at that area.

What is claimed is:

1. A recording device comprising a recording medium having a thin layer of a magnetizable material having an easily magnetizable direction which is approximately at right angles to a surface of said layer, and means for producing magnetic domains therein, said medium containing magnetic domains at least some of which have a hollow domain therein, said hollow domain being defined as a region within said magnetic domain in which the direction of the magnetization is directed opposite to said magnetic domain but the same to an external magnetic field, said medium further containing impurities for providing said medium with lattice defects so that variation of said external magnetic field is increased.

2. A device as defined in claim 1, wherein said recording medium shows a sufficient coercive force so that the dimensions of said domains do not increase in response to a periodically varying external field of constant maximum amplitude perpendicular to said layer.

3. A device as defined in claim 1, wherein said recording medium shows a sufficient coercive force so that the dimensions of said domains nonmonotonically decrease in response to a periodically varying external field of constant maximum amplitude perpendicular to said layer.

4. A device as defined in claim 1, further comprising a single-walled domain within at least one of said hollow domains.

5. A device as defined in claim 1, further comprising means for moving said domains on said recording medium.

6. A device as defined in claim 1, wherein said recording medium has a non-zero coercive magnetic field.

7. A device as defined in claim 1, wherein said recording medium is composed of orthoferrite material.

8. A recording device comprising a recording medium having a thin layer of a magnetizable material having an easily magnetizable direction which is approximately at right angles to a surface of said layer, and means for producing magnetic domains therein, said medium containing magnetic domains at least some of which have a hollow domain therein, said hollow domain being defined as a region within said magnetic domain in which the direction of the magnetization is directed opposite to said magnetic domain but the same to an external magnetic field, said medium further containing impurities for providing said medium with lattice defects so that variation of said external magnetic field is increased, at least some of said hollow domains having therein a closed hollow structure.

* * * * *

UNITED STATES PATENT AND TRADEMARK OFFICE
CERTIFICATE OF CORRECTION

PATENT NO. : 4004287
DATED : January 18, 1977
INVENTOR(S) : FREDERIK ATE DE JONGE ET AL It is certified that error appears in the above-identified patent and that said Letters Patent are hereby corrected as shown below:

Column 2, line 16, "$(r < R_2)$" should be --$(r > R_2)$--.

Column 3, line 64, "$r < R_5$" should be --$r > R_5$--.

Column 5, line 67, after "resulting" should be --magnetic field in the region between the projections--

Signed and Sealed this

Twenty-eighth Day of June 1977

[SEAL]

Attest:

RUTH C. MASON
Attesting Officer

C. MARSHALL DANN
Commissioner of Patents and Trademarks